United States Patent
Fukahori

(10) Patent No.: US 10,770,451 B2
(45) Date of Patent: Sep. 8, 2020

(54) THIN-FILM ESD PROTECTION DEVICE

(71) Applicant: Murata Manufacturing Co., Ltd., Nagaokakyo-shi, Kyoto-fu (JP)

(72) Inventor: Souko Fukahori, Nagaokakyo (JP)

(73) Assignee: MURATA MANUFACTURING CO, LTD., Nagaokakyo-Shi, Kyoto-Fu (JP)

( * ) Notice: Subject to any disclaimer, the term of this patent is extended or adjusted under 35 U.S.C. 154(b) by 29 days.

(21) Appl. No.: 16/227,155

(22) Filed: Dec. 20, 2018

(65) Prior Publication Data
US 2019/0123040 A1 Apr. 25, 2019

Related U.S. Application Data

(63) Continuation of application No. PCT/JP2018/000631, filed on Jan. 12, 2018.

(30) Foreign Application Priority Data

Mar. 17, 2017 (JP) .................. 2017-052214

(51) Int. Cl.
*H01L 27/08* (2006.01)
*H01L 27/02* (2006.01)
(Continued)

(52) U.S. Cl.
CPC ...... *H01L 27/0288* (2013.01); *H01L 21/3205* (2013.01); *H01L 23/528* (2013.01);
(Continued)

(58) Field of Classification Search
CPC ............. H01L 27/0288; H01L 21/3205; H01L 23/642; H01L 23/528; H01L 23/645; H01L 27/0255; H01L 27/0676
(Continued)

(56) References Cited

U.S. PATENT DOCUMENTS 6,936,877 B2 8/2005 Klee et al.
7,786,837 B2 * 8/2010 Hebert .................. H01F 27/292
257/738

(Continued)

FOREIGN PATENT DOCUMENTS

JP 2001185685 A 7/2001
JP 2004523924 A 8/2004
(Continued)

OTHER PUBLICATIONS

International Search Report issued in PCT/JP2018/000631, dated Feb. 13, 2018.

*Primary Examiner* — Vu A Vu
(74) *Attorney, Agent, or Firm* — Arent Fox LLP

(57) ABSTRACT

A thin-film ESD protection device that includes a semiconductor substrate having a first and second principal surfaces); a first insulating layer disposed on the first principal surface; a second insulating layer disposed formed on the second principal surface; and first and second input/output electrodes, ground electrodes, a diode element, a capacitor element, and an inductor element. The capacitor element and the diode element are formed adjacent to the first principal surface, whereas the inductor element is formed adjacent to the second principal surface. The inductor element is connected to the first input/output electrode and the second input/output electrode by a first via conductor and a second via conductor, respectively, that pass through the semiconductor substrate from the first principal surface to the second principal surface.

20 Claims, 13 Drawing Sheets

(51) Int. Cl.
  *H01L 23/64* (2006.01)
  *H01L 23/528* (2006.01)
  *H01L 21/3205* (2006.01)
  *H01L 27/06* (2006.01)

(52) U.S. Cl.
  CPC .......... *H01L 23/642* (2013.01); *H01L 23/645* (2013.01); *H01L 27/0255* (2013.01); *H01L 27/0676* (2013.01)

(58) Field of Classification Search
  USPC ....................................................... 257/531
  See application file for complete search history.

(56) References Cited

U.S. PATENT DOCUMENTS

| | | | |
|---|---|---|---|
| 7,838,965 | B2 | 11/2010 | Klee et al. |
| 8,067,816 | B2 | 11/2011 | Kim et al. |
| 8,324,066 | B2 | 12/2012 | Kim et al. |
| 8,350,358 | B2 | 1/2013 | Kim et al. |
| 8,693,157 | B2 | 4/2014 | Noma et al. |
| 9,397,251 | B2 * | 7/2016 | Eickelmann ...... H01L 21/02565 |
| 10,153,267 | B2 | 12/2018 | Nomura et al. |
| 2002/0177326 | A1 | 11/2002 | Klee et al. |
| 2003/0011031 | A1 | 1/2003 | Brewer et al. |
| 2007/0257761 | A1 | 11/2007 | Mano et al. |
| 2008/0258257 | A1 | 10/2008 | Klee et al. |
| 2010/0193905 | A1 | 8/2010 | Kim et al. |
| 2011/0038088 | A1 | 2/2011 | Noma et al. |
| 2012/0001297 | A1 | 1/2012 | Kim et al. |
| 2012/0040509 | A1 | 2/2012 | Kim et al. |
| 2016/0351556 | A1 * | 12/2016 | Nakaiso .............. H01L 27/0805 |
| 2017/0125398 | A1 | 5/2017 | Nomura et al. |
| 2017/0256497 | A1 * | 9/2017 | Mano .................. H01L 23/5383 |

FOREIGN PATENT DOCUMENTS

| | | |
|---|---|---|
| JP | 2008054055 A | 3/2008 |
| JP | 2008103397 A | 5/2008 |
| JP | 2008532308 A | 8/2008 |
| JP | 2011192780 A | 9/2011 |
| JP | 2012517109 A | 7/2012 |
| WO | 03007451 A1 | 1/2003 |
| WO | 2007129526 A1 | 11/2007 |
| WO | 2009136535 A1 | 11/2009 |
| WO | 2015025753 A1 | 2/2015 |
| WO | 2016013555 A1 | 1/2016 |

* cited by examiner

THIN-FILM ESD PROTECTION DEVICE

CROSS REFERENCE TO RELATED APPLICATIONS

The present application is a continuation of PCT/JP2018/000631 filed Jan. 1, 2018, which claims priority to Japanese Patent Application No. 2017-052214, filed Mar. 17, 2017, the entire contents of each of which are incorporated herein by reference.

TECHNICAL FIELD

The present disclosure relates to a thin-film ESD protection device having an ESD protection function, and, more particularly, relates to a thin-film ESD protection device including a capacitor, an inductor, and a diode.

BACKGROUND

To prevent damage to, and malfunction of, electronic devices caused by electro-static discharge (ESD), various types of ESD protection circuits are currently used. ESD protection circuits are circuits that protect a subsequent electronic circuit from ESD by transferring ESD to the ground or the like. For example, an ESD protection circuit is disposed between a signal line and the ground (or earth).

For example, Patent Document 1 (identified below) discloses an electronic device in which, as a protective measure against ESD, a filter circuit having an ESD protection function is provided in the vicinity of an antenna terminal.

Patent Document 1: Japanese Unexamined Patent Application Publication No. 2008-54055.

However, mounting a plurality of discrete components on a mount board to form a circuit having an ESD protection function, such as that described in Patent Document 1, requires a large mounting area. Moreover, since wiring for connecting the discrete components is formed on the mount board, the resulting increase in wiring length also causes an increase in parasitic inductance, which may make it difficult to achieve required characteristics.

SUMMARY OF THE INVENTION

An object of the present disclosure is to provide a thin-film ESD protection device with reduced variation in electrical characteristics, requiring a smaller mounting area, and thus is compact in size.

A thin-film ESD protection device according to an exemplary embodiment includes a semiconductor substrate having a first principal surface and a second principal surface opposite each other; a first insulating layer formed on the first principal surface; a first input/output electrode, a second input/output electrode, and a ground electrode formed on a surface of the first insulating layer. Moreover, a diode element is formed adjacent to the first principal surface of the semiconductor substrate, with the diode element having a first end electrically connected to the first input/output electrode and a second end electrically connected to the ground electrode; a capacitor element is formed adjacent to the first principal surface of the semiconductor substrate, with the capacitor element having a third end electrically connected to the second input/output electrode and a fourth end electrically connected to the ground electrode; and an inductor element is formed adjacent to the second principal surface of the semiconductor substrate, with the inductor element having a fifth end and a sixth end. The fifth end of the inductor element is electrically connected to the first input/output electrode by a first via conductor passing through the semiconductor substrate from the first principal surface to the second principal surface, and the sixth end of the inductor element is electrically connected to the second input/output electrode by a second via conductor passing through the semiconductor substrate from the first principal surface to the second principal surface.

In this configuration, the diode element, the capacitor element, and the inductor element are integrally formed. Advantageously, the mounting area required to form a circuit can be made smaller than when a chip inductor, a chip capacitor, and a chip diode (which are discrete components) are mounted on a mount board or the like. Moreover, with this configuration, the wiring length between the inductor element and the diode element and the wiring length between the inductor element and the capacitor element can be made shorter than when the discrete components are mounted on a mount board or the like. Therefore, the conductor resistance and the parasitic inductance in the wiring between the inductor element and the diode element and in the wiring between the inductor element and the capacitor element can be reduced. Thus, according to the exemplary embodiment, a thin-film ESD protection device is provided having low ESD suppression voltage and that is high in responsivity.

Also, in this configuration, the diode element and the capacitor element are formed adjacent to the first principal surface of the semiconductor substrate, whereas the inductor element is formed adjacent to the second principal surface of the semiconductor substrate. Therefore, as compared to when the diode element, the capacitor element, and the inductor element are all formed adjacent to one principal surface of the semiconductor substrate, the mounting area of the thin-film ESD protection device (particularly the area on the flat surface) can be made smaller. Moreover, as compared to when the capacitor element and the inductor element are both formed adjacent to one principal surface of the semiconductor substrate, this configuration makes it easier to ensure isolation between the capacitor element and the inductor element and makes it more difficult for eddy current to flow through capacitor electrodes forming the capacitor element.

According to an exemplary aspect, the semiconductor substrate is preferably a high-resistivity substrate. With this configuration, where eddy current does not easily flow through the semiconductor substrate, the inductor element with a high Q factor and low eddy current loss can be obtained. With this configuration, where the high-resistivity substrate is interposed between the capacitor element and the inductor element, the isolation between the capacitor element and the inductor element is further improved. This makes it more difficult for eddy current to flow through the capacitor electrodes forming the capacitor element and makes it possible to obtain the inductor element with a higher Q factor.

According to another exemplary aspect, the diode element and the capacitor element preferably do not overlap in plan view of the first principal surface or second principal surface. If the capacitor element is disposed in an overlapping manner over the diode element, it is difficult to ensure flatness of the capacitor electrodes forming the capacitor element. With the configuration describe above, it is possible to reduce changes in capacitance and risk of short circuits caused by unevenness of the capacitor electrodes.

According to another exemplary aspect, the semiconductor substrate, the first insulating layer, and a second insulating layer formed on the second principal surface preferably form a multilayer body. Moreover, the multilayer body is preferably in the shape of a rectangle having a first side and a second side opposite each other in plan view of the first principal surface or second principal surface; the first input/output electrode and the second input/output electrode are preferably disposed near the first side; and the ground electrode is preferably disposed near the second side. This configuration does not require routing of long wiring in a planar direction parallel to the first principal surface and the second principal surface and allows each of the elements (inductor element, diode element, and capacitor element) and the corresponding electrode to be connected in the shortest distance. It is thus possible to reduce the conductor resistance and the parasitic inductance in the wiring between each element and the electrode.

According to another exemplary aspect, the second insulating layer is preferably at least partly formed by a magnetic body, and the inductor element preferably includes the magnetic body and a coil conductor formed adjacent to the second principal surface. With this configuration, because of the high magnetic permeability of the magnetic body, an inductor element having a predetermined inductance value can be obtained even with fewer turns.

According to another exemplary aspect, the coil conductor is preferably formed on the second principal surface, and the magnetic body is preferably a magnetic sheet attached to the second principal surface. In general, forming a fine conductor pattern on the semiconductor substrate to produce a coil conductor having many turns involves many manufacturing steps. However, the configuration described herein requires fewer person-hours in the manufacturing process and lower costs, because an inductor element having a predetermined inductance value can be produced simply by attaching the magnetic sheet to the second principal surface of the semiconductor substrate.

According to another exemplary aspect, the inductor element preferably includes the magnetic body and the coil conductor formed in the magnetic body, and the magnetic body is preferably a sheet attached to the second principal surface. With this configuration, by the magnetic shielding effect of the magnetic body, a magnetic field from the inductor element can be prevented from radiating out of the sheet. This further improves isolation between the capacitor element and the inductor element.

According to another exemplary aspect, the first via conductor or the second via conductor preferably has a magnetic film formed over an outer periphery thereof. With this configuration, the inductance component of the thin-film ESD protection device can be easily improved. This simply involves forming a magnetic layer on the inner wall of a hole passing through the semiconductor substrate from the first principal surface to the second principal surface. Therefore, without significantly increasing the number of person-hours in the manufacturing process, a predetermined inductance can be obtained more easily than when, for example, coil conductors are stacked.

According to another exemplary aspect, the inductor element and the capacitor element may form a low-pass filter.

The exemplary embodiments of the present disclosure provide a thin-film ESD protection device that facilitates reduced variation in electrical characteristics, requires a smaller mounting area, and thus is compact in size.

DETAILED DESCRIPTION OF EMBODIMENTS

Figure 1A:
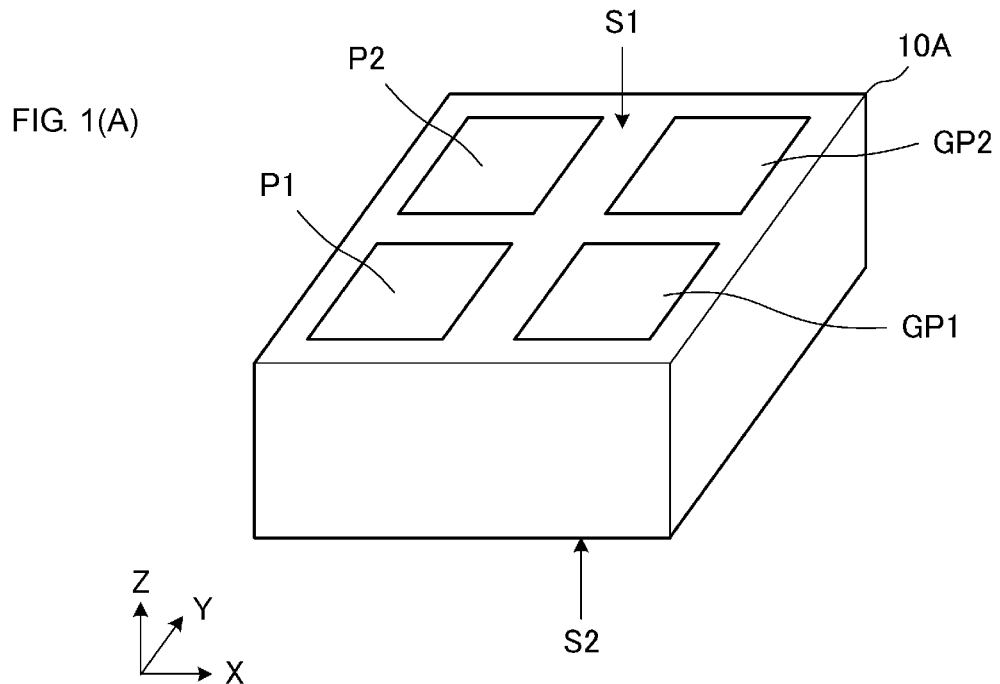
FIG. 1(A) is a perspective view of a thin-film ESD protection device 101 according to a first embodiment.

Hereinafter, a plurality of exemplary embodiments will be described using some specific examples with reference to drawings. In the drawings, the same elements are denoted by the same reference numerals. For convenience and ease of explanation and understanding of essential points, different embodiments are presented in different sections. However, some of configurations presented in different embodiments may be replaced or combined. In the second and subsequent embodiments, the description of elements that are the same as those presented in the first embodiment will be omitted and different points alone will be discussed. In particular, similar advantageous effects achieved by similar configurations will not be mentioned one by one in each embodiment.

First Embodiment

Figure 1B:
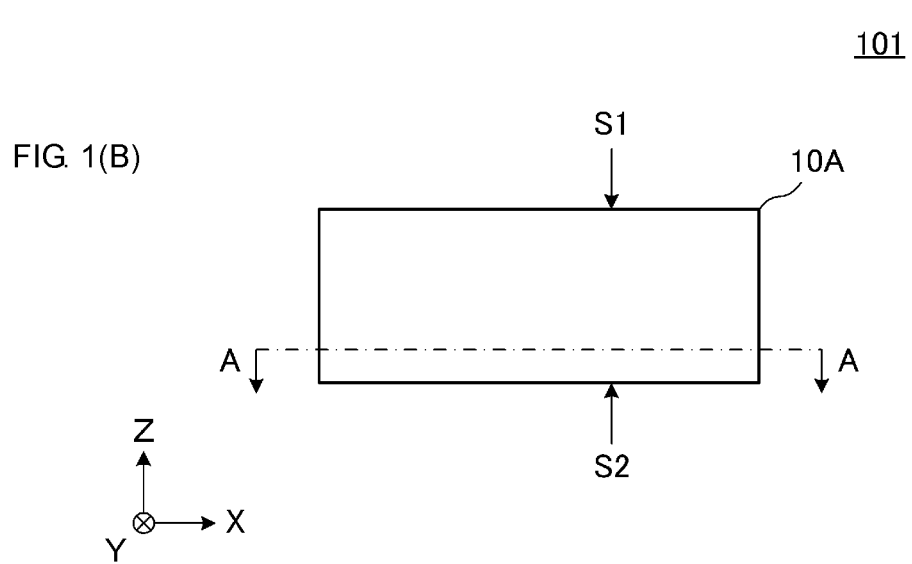
FIG. 1(B) is a front view of the thin-film ESD protection device 101.
Figure 2A:
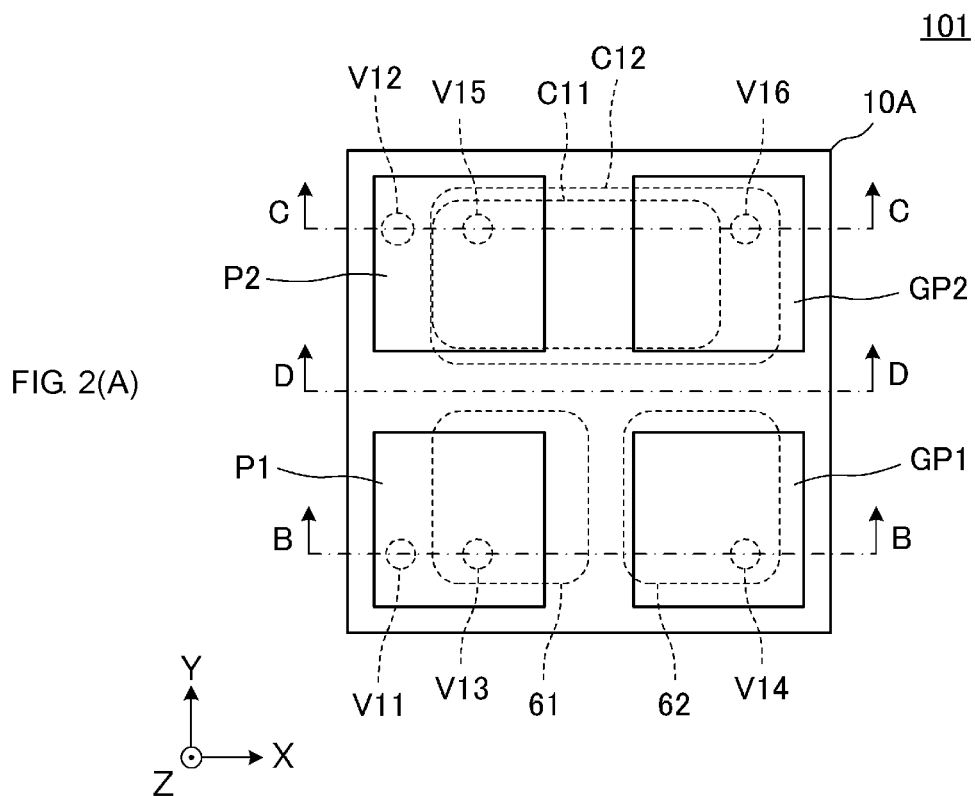
FIG. 2(A) is a plan view of the thin-film ESD protection device 101.
Figure 2B:
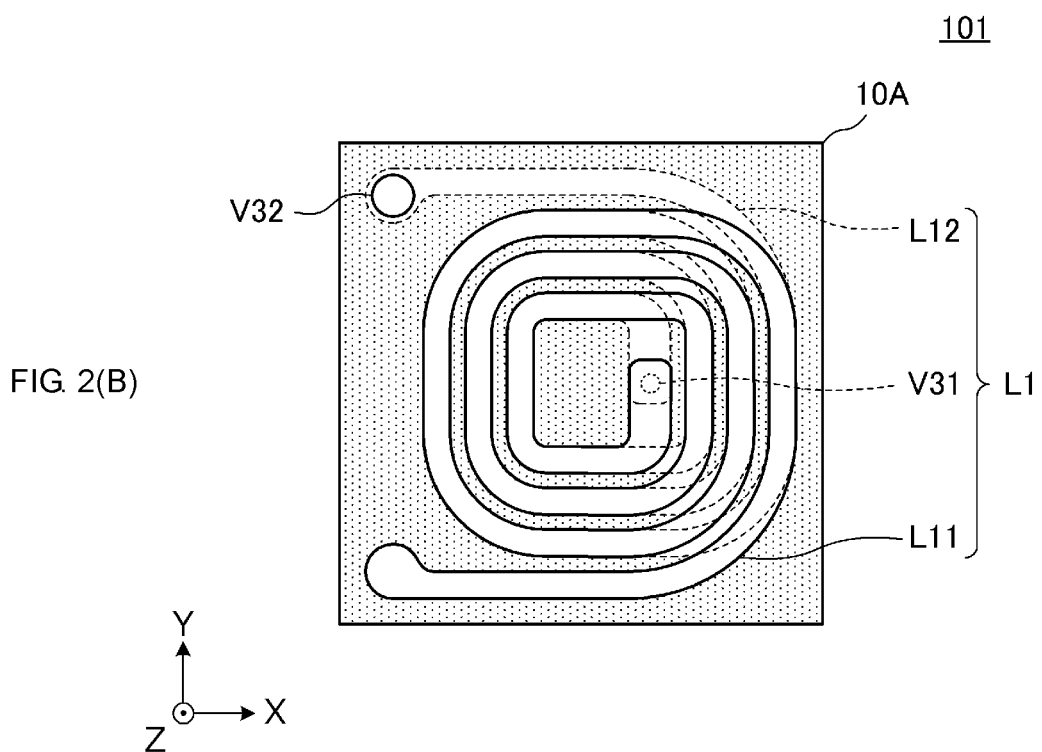
FIG. 2(B) is a cross-sectional view taken along line A-A in FIG. 1(B).
Figure 3A:
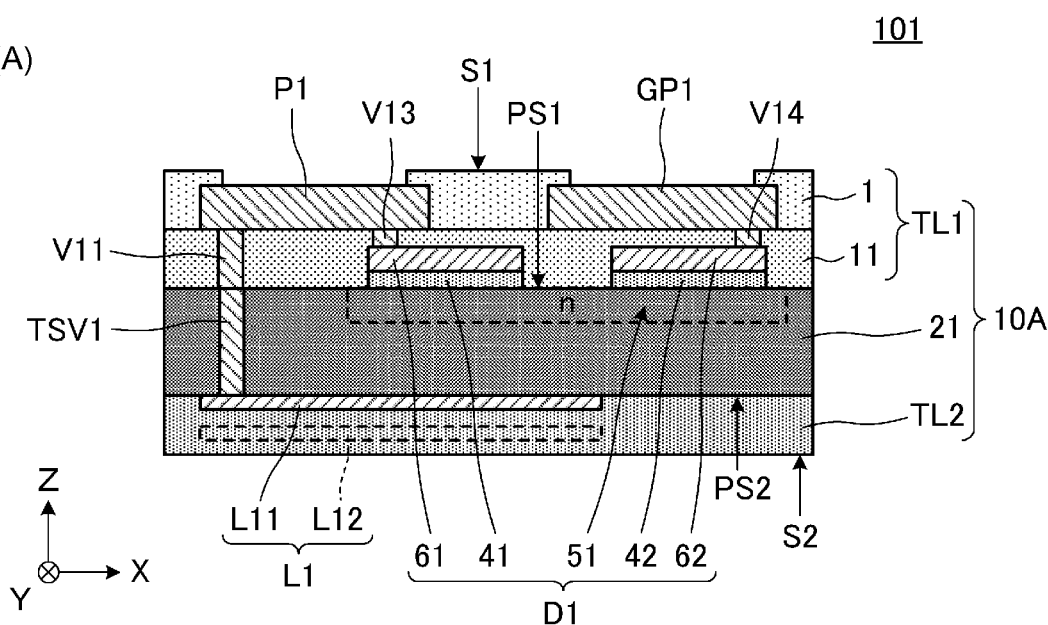
FIG. 3(A) is a cross-sectional view taken along line B-B in FIG. 2(A)
Figure 3B:
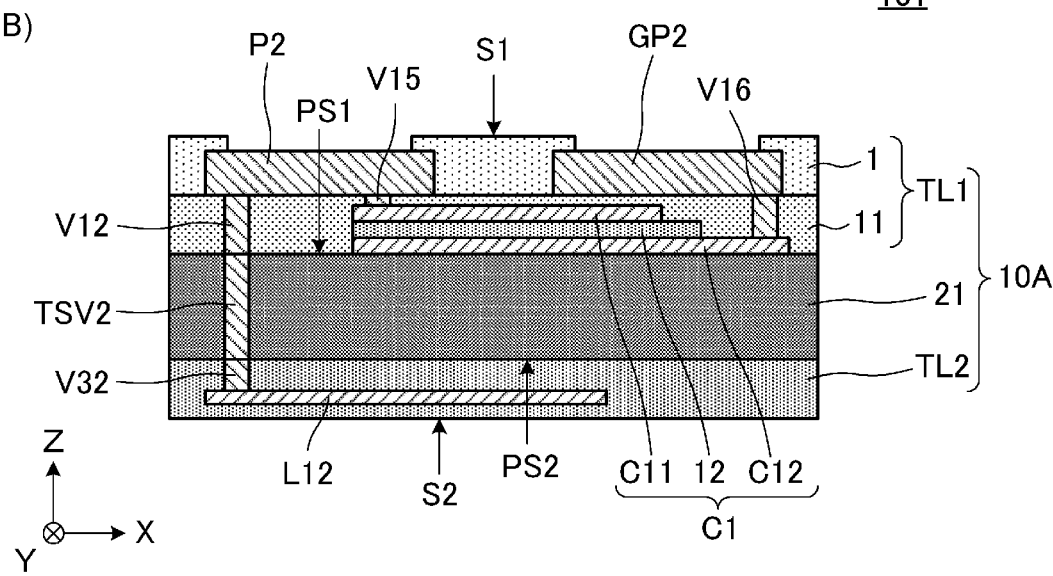
FIG. 3(B) is a cross-sectional view taken along line C-C in FIG. 2(A).
Figure 4:
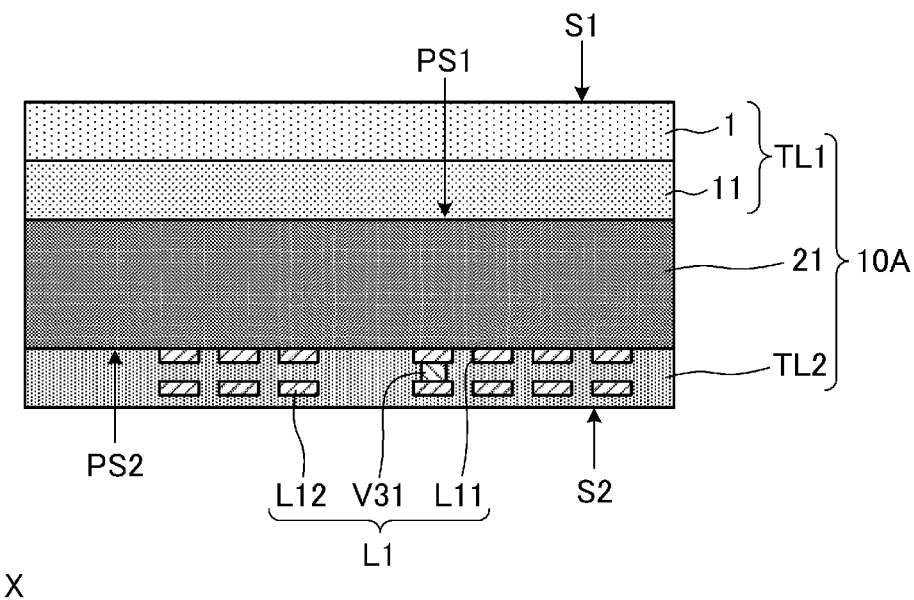
FIG. 4 is a cross-sectional view taken along line D-D in FIG. 2(A).

FIG. 1(A) is a perspective view of a thin-film ESD protection device 101 according to a first embodiment, and FIG. 1(B) is a front view of the thin-film ESD protection device 101. FIG. 2(A) is a plan view of the thin-film ESD protection device 101, and FIG. 2(B) is a cross-sectional view taken along line A-A in FIG. 1(B). FIG. 3(A) is a cross-sectional view taken along line B-B in FIG. 2(A), and FIG. 3(B) is a cross-sectional view taken along line C-C in FIG. 2(A). FIG. 4 is a cross-sectional view taken along line D-D in FIG. 2(A).

Referring to FIGS. 3(A) and 3(B), for example, the thin-film ESD protection device 101 includes a semiconductor substrate 21, a first insulating layer TL1, a second insulating layer TL2, a first input/output electrode P1, a second input/output electrode P2, ground electrodes GP1 and GP2, a diode element D1, a capacitor element C1, and an inductor element L1.

The semiconductor substrate 21 is a rectangular-parallelepiped-shaped semiconductor substrate having a first principal surface PS1 and a second principal surface PS2 opposite each other and having a longitudinal direction parallel to the Y-axis direction. The semiconductor substrate 21 includes a first via conductor TSV1 and a second via conductor TSV2 both passing therethrough from the first principal surface PS1 to the second principal surface PS2. The semiconductor substrate 21 is, for example, a high-resistivity Si substrate. The first via conductor TSV1 and the second via conductor TSV2 are both, for example, through-silicon (Si) vias (TSVs) according to the exemplary embodiment.

According to the present disclosure, the term "high-resistivity" refers to an average electrical resistivity of 1.0 ($\Omega \cdot cm$) or more.

As illustrated, for example, in FIGS. 3(A) and 3(B), a first capacitor electrode C11, a second capacitor electrode C12, a thin-film dielectric layer 12, p-type semiconductor layers 41 and 42, diode electrodes 61 and 62, and interlayer connection conductors V11, V12, V13, V14, V15, and V16 are formed (i.e., disposed) adjacent to the first principal surface PS1 of the semiconductor substrate 21. At the same time, coil conductors L11 and L12 and interlayer connection conductors V31 and V32 are formed adjacent to the second principal surface PS2 of the semiconductor substrate 21, which opposes the first principal surface PS1. The first capacitor electrode C11, the second capacitor electrode C12, and the diode electrodes 61 and 62 are, for example, Al films. The thin-film dielectric layer 12 is, for example, a $SiO_2$ film. The coil conductors L11 and L12 are, for example, conductor patterns made of Cu.

The first insulating layer TL1 is an insulating layer formed on the first principal surface PS1 of the semiconductor substrate 21 by a thin-film process. The first insulating layer TL1 includes an insulating layer 11 formed on the first principal surface PS1 of the semiconductor substrate 21 and a protective layer 1 formed on the surface of the insulating layer 11. The insulating layer 11 is, for example, a $SiO_2$ film, and the protective layer 1 is made of, for example, polyimide (PI) resin, epoxy (EP) resin, or polybenzoxazole (PBO) resin.

The second insulating layer TL2 is an insulating layer formed on the second principal surface PS2 of the semiconductor substrate 21. The second insulating layer TL2 is made of, for example, polyimide (PI) resin, epoxy (EP) resin, or polybenzoxazole (PBO) resin. The coil conductors L11 and L12 are, for example, conductor patterns made of Cu.

The semiconductor substrate 21, the first insulating layer TL1, and the second insulating layer TL2 form a multilayer body 10A in the present embodiment. The multilayer body 10A is a substantially rectangular-parallelepiped-shaped body having a first surface S1 and a second surface S2. In plan view of the first principal surface PS1 and the second principal surface PS2 (i.e., as viewed from the Z-axis direction), the multilayer body 10A is in the shape of a rectangle having a first side and a second side (e.g., a left-hand side and a right-hand side of the multilayer body 10A in FIG. 2(A)) opposite each other.

The first input/output electrode P1, the second input/output electrode P2, and the ground electrodes GP1 and GP2 are terminals arranged in a land grid array (LGA) for mounting on a mount board or the like, and are formed like rectangular islands on a surface of the first insulating layer TL1 (or on the first surface S1 of the multilayer body 10A). The first input/output electrode P1, the second input/output electrode P2, and the ground electrodes GP1 and GP2 are, for example, conductors formed by Ni/Au plating a conductor pattern of Cu on the surface of the insulating layer 11.

In the present embodiment, the first input/output electrode P1 and the second input/output electrode P2 are disposed near the first side (or the left-hand side of the multilayer body 10A in FIG. 2(A)), and the ground electrodes GP1 and GP2 are disposed near the second side (or the right-hand side of the multilayer body 10A in FIG. 2(A)).

The diode element D1 is formed adjacent to the first principal surface PS1 of the semiconductor substrate 21 and includes an n-type semiconductor layer 51, the p-type semiconductor layers 41 and 42, and the diode electrodes 61 and 62. Specifically, as illustrated in FIG. 3(A), the n-type semiconductor layer 51 (n-type well) with a predetermined depth is formed adjacent to the first principal surface PS1 of the semiconductor substrate 21. The n-type semiconductor layer 51 is partly exposed on the first principal surface PS1 of the semiconductor substrate 21, and the two p-type semiconductor layers 41 and 42 are arranged to be spaced apart on the surface of the n-type semiconductor layer 51 (i.e., on the first principal surface PS1). The p-type semiconductor layers 41 and 42 are formed, for example, by chemical vapor deposition (CVD). The diode electrodes 61 and 62 are formed on the respective surfaces of the two p-type semiconductor layers 41 and 42. The diode element D1 is thus formed by connecting the cathodes of two p-n junction diodes and has Zener characteristics. Therefore, the diode element D1 functions as an ESD protection element.

The diode electrode 61 (corresponding to "first end of diode element") is electrically connected by the interlayer connection conductor V13 to the first input/output electrode P1, and the diode electrode 62 (corresponding to "second end of diode element") is electrically connected by the interlayer connection conductor V14 to the ground electrode GP1.

According to the present disclosure, the term "electrically connected" refers to being brought into conduction through either direct or indirect connection.

The capacitor element C1 is formed adjacent to the first principal surface PS1 of the semiconductor substrate 21 and includes the first capacitor electrode C11, the second capacitor electrode C12, and the thin-film dielectric layer 12. As illustrated in FIG. 3(B), the second capacitor electrode C12, the thin-film dielectric layer 12, and the first capacitor electrode C11 are stacked in this order on the first principal surface PS1 of the semiconductor substrate 21.

The first capacitor electrode C11 (corresponding to "third end of capacitor element") is electrically connected by the interlayer connection conductor V15 to the second input/output electrode P2. The second capacitor electrode C12 (corresponding to "fourth end of capacitor element") is electrically connected by the interlayer connection conductor V16 to the ground electrode GP2.

As illustrated, for example, in FIG. 4, the inductor element L1 is formed adjacent to the second principal surface PS2 of the semiconductor substrate 21 and includes the coil conductors L11 and L12 and the interlayer connection conductor V31. The inductor element L1 is a coil having a winding axis extending in the Z-axis direction. As illustrated in FIG. 2(B), the coil conductor L11 is a rectangular spiral conductor of about 3.5 turns formed on the second principal surface PS2 of the semiconductor substrate 21. The coil conductor L12 is a rectangular spiral conductor of about 3.5 turns formed inside the second insulating layer TL2. One end of the coil conductor L11 is connected to one end of the coil conductor L12, with the interlayer connection conductor V31 interposed therebetween.

As illustrated, for example, in FIG. 3(A), the other end of the coil conductor L11 (corresponding to "fifth end of inductor element") is electrically connected by the first via conductor TSV1 and the interlayer connection conductor V11 to the first input/output electrode P1. As illustrated, for example, in FIG. 3(B), the other end of the coil conductor L12 (corresponding to "sixth end of inductor element") is electrically connected by the second via conductor TSV2 and the interlayer connection conductors V12 and V32 to the second input/output electrode P2.

In the present embodiment, as illustrated, for example, in FIG. 2(A), the diode element D1 and the capacitor element C1 do not overlap, as viewed from the Z-axis direction.

Figure 5:
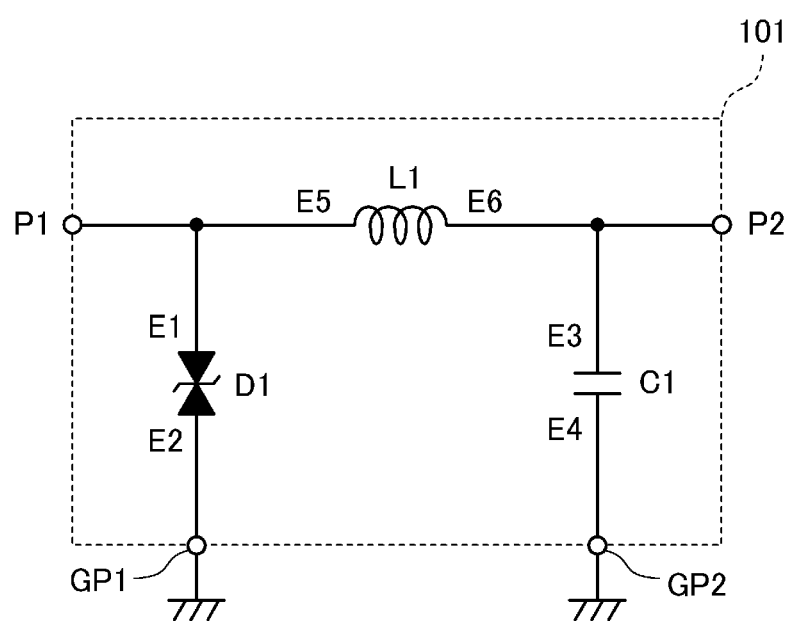
FIG. 5 is a circuit diagram of the thin-film ESD protection device 101.

FIG. 5 is a circuit diagram of the thin-film ESD protection device 101.

The thin-film ESD protection device 101 is a circuit where the inductor element L1 is connected between the first input/output electrode P1 and the second input/output electrode P2, the diode element D1 is connected between the first input/output electrode P1 and the ground electrode GP1, and the capacitor element C1 is connected between the second input/output electrode P2 and the ground electrode GP2.

A first end E1 of the diode element D1 is electrically connected to the first input/output electrode P1, and a second end E2 of the diode element 1 is electrically connected to the ground electrode GP1. A third end E3 of the capacitor element C1 is electrically connected to the second input/output electrode P2, and a fourth end E4 of the capacitor element C1 is electrically connected to the ground electrode GP2. A fifth end E5 of the inductor element L1 is electrically connected to the first input/output electrode P1 and the first end E1 of the diode element D1, and a sixth end E6 of the inductor element L1 is electrically connected to the second input/output electrode P2 and the third end E3 of the capacitor element C1.

Thus, in the thin-film ESD protection device 101, the diode element D1, the inductor element L1, and the capacitor element C1 form a low-pass filter having an ESD protection function.

According to the exemplary embodiment, the thin-film ESD protection device 101 has the following advantageous effects.

First, in the thin-film ESD protection device 101, the diode element D1, the capacitor element C1, and the inductor element L1 are integrally formed. Therefore, the mounting area required to form a circuit can be made smaller than when a chip inductor, a chip capacitor, and a chip diode (which are discrete components) are mounted on a mount board or the like. With this configuration, moreover, the wiring length between the inductor element and the diode element and the wiring length between the inductor element and the capacitor element can be made shorter than when the discrete components are mounted on a mount board or the like. Therefore, the conductor resistance and the parasitic inductance in the wiring between the inductor element and the diode element and in the wiring between the inductor element and the capacitor element can be reduced. It is thus possible to provide a thin-film ESD protection device which is low in ESD suppression voltage and high in responsivity.

In addition, in the thin-film ESD protection device 101, the diode element D1 and the capacitor element C1 are formed adjacent to the first principal surface PS1 of the semiconductor substrate 21, whereas the inductor element L1 is formed adjacent to the second principal surface PS2 of the semiconductor substrate 21. Therefore, as compared to when the diode element D1, the capacitor element C1, and the inductor element L1 are all formed adjacent to one principal surface of the semiconductor substrate 21, the mounting area of the thin-film ESD protection device (particularly the area on the flat surface) can be made smaller. Moreover, as compared to when the capacitor element C1 and the inductor element L1 are both formed adjacent to one principal surface of the semiconductor substrate 21, this configuration makes it easier to ensure isolation between the capacitor element C1 and the inductor element L1 and makes it more difficult for eddy current to flow through capacitor electrodes forming the capacitor element C1.

Yet further, in the thin-film ESD protection device 101, the diode element D1 is formed adjacent to the first principal surface PS1 of the semiconductor substrate 21. With this configuration, as compared to when the diode element D1 is formed on the second insulating layer TL2, the wiring length between the diode element D1 and the ground electrode GP1 can be made shorter and the conductor resistance and the parasitic inductance in the wiring between the diode element D1 and the ground electrode GP1 can be made smaller. It is thus possible to provide a thin-film ESD protection device which is low in ESD suppression voltage and high in responsivity.

Furthermore, in the thin-film ESD protection device 101, the capacitor element C1 is formed adjacent to the first principal surface PS1 of the semiconductor substrate 21. With this configuration, as compared to when the capacitor element C1 is formed in the second insulating layer TL2, the wiring length between the capacitor element C1 and the ground electrode GP2 can be made shorter and the conductor resistance and the parasitic inductance in the wiring between the capacitor element C1 and the ground electrode GP2 can be made smaller. It is thus possible to obtain a low-pass filter with low insertion loss.

In addition, as in the thin-film ESD protection device 101, the diode element D1 and the capacitor element C1 preferably do not overlap as viewed from the Z-axis direction. If the capacitor element C1 is disposed in an overlapping manner over the diode element D1, it is difficult to ensure flatness of the capacitor electrodes forming the capacitor element C1. With the configuration describe above, it is possible to reduce changes in capacitance and risk of short circuits caused by unevenness of the capacitor electrodes.

In addition, according to the present embodiment, where the semiconductor substrate 21 is a high-resistivity Si substrate, eddy current does not easily flow through the semiconductor substrate 21. Therefore, the inductor element L1 with a high Q factor and low eddy current loss can be obtained. In the thin-film ESD protection device 101, where the high-resistivity Si substrate is interposed between the capacitor element C1 and the inductor element L1, the isolation between the capacitor element C1 and the inductor element L1 is further improved. This configuration makes it more difficult for eddy current to flow through the capacitor electrodes forming the capacitor element C1 and makes it possible to obtain the inductor element L1 with a higher Q factor.

Yet further, according to the present embodiment, the multilayer body 10A is in the shape of a rectangle having the first side and the second side opposite each other, as viewed from the Z-axis direction, and the first input/output electrode P1 and the second input/output electrode P2 are disposed near the first side and the ground electrodes GP1 and GP2 are disposed near the second side. Advantageously, this configuration does not require routing of long wiring in a planar direction (e.g., X-axis direction or Y-axis direction) parallel to the first principal surface PS1 and the second principal surface PS2 and allows each of the elements (inductor element L1, diode element D1, and capacitor element C1) and the corresponding electrode to be connected in the shortest distance. It is thus possible to reduce the conductor resistance and the parasitic inductance in the wiring between each element and the electrode.

According to an exemplary aspect, the thin-film ESD protection device 101 can be manufactured, for example, by the following steps.

First, the semiconductor substrate 21 having the first principal surface PS1 and the second principal surface PS2 opposite each other is prepared. The semiconductor substrate 21 is, for example, a high-resistivity Si substrate.

The first via conductor TSV1 and the second via conductor TSV2 are formed in the semiconductor substrate 21 in such a manner that they pass through the semiconductor substrate 21 from the first principal surface PS1 to the second principal surface PS2. Specifically, after holes that pass through the semiconductor substrate 21 from the first principal surface PS1 to the second principal surface PS2 are formed by the Bosch process, a TiN base film is formed, for example, by ion sputtering. Then, for example, the holes are each internally plated with a conductive material, such as Cu. The first via conductor TSV1 and the second via conductor TSV2 are both, for example, through-silicon (Si) vias (TSVs).

Next, the diode element D1 is formed adjacent to the first principal surface PS1 of the semiconductor substrate 21. Specifically, first, an insulating film (not shown) with a predetermined cavity is formed adjacent to the first principal surface PS1 of the semiconductor substrate 21, and the cavity is doped with n-type impurities to form the n-type semiconductor layer 51 (n-type well). Next, the p-type semiconductor layers 41 and 42 are formed by patterning using chemical vapor deposition (CVD) on the surface of the n-type semiconductor layer 51 (i.e., on the first principal surface PS1). Then, the diode electrodes 61 and 62 are formed on the respective surfaces of the p-type semiconductor layers 41 and 42. The diode electrodes 61 and 62 are, for example, Al films.

The diode element D1 including the n-type semiconductor layer 51, the p-type semiconductor layers 41 and 42, and the diode electrodes 61 and 62 are thus formed adjacent to the first principal surface PS1 of the semiconductor substrate 21.

Additionally, the capacitor element C1 is formed on the first principal surface PS1 of the semiconductor substrate 21 (in a region outside the n-type semiconductor layer 51). Specifically, first, the second capacitor electrode C12 is formed. Then, the thin-film dielectric layer 12 is formed on the surface of the second capacitor electrode C12. Next, the first capacitor electrode C11 is formed on the surface of the thin-film dielectric layer 12. The first capacitor electrode C11 and the second capacitor electrode C12 are, for example, Al films. The thin-film dielectric layer 12 is, for example, a $SiO_2$ film formed by chemical vapor deposition (CVD).

The capacitor element C1 including the first capacitor electrode C11, the second capacitor electrode C12, and the thin-film dielectric layer 12 is thus formed on the first principal surface PS1 of the semiconductor substrate 21.

The diode electrodes 61 and 62 and the first capacitor electrode C11 may be simultaneously formed in the same step according to one exemplary aspect.

Next, the insulating layer 11 is formed on the first principal surface PS1 of the semiconductor substrate 21. Specifically, the insulating layer 11 is formed by chemical vapor deposition (CVD) at least to a level which allows the p-type semiconductor layers 41 and 42, the diode electrodes 61 and 62, the first capacitor electrode C11, the second capacitor electrode C12, and the thin-film dielectric layer 12 to be buried. The insulating layer 11 is, for example, a $SiO_2$ film.

Next, the interlayer connection conductors V11, V12, V13, V14, V15, and V16 are formed in the insulating layer 11. Specifically, after holes are formed by etching at the positions of the interlayer connection conductors in the insulating layer 11, the interlayer connection conductors V11, V12, V13, V14, V15, and V16 are formed, for example, by ion sputtering.

Next, the first input/output electrode P1, the second input/output electrode P2, and the ground electrodes GP1 and GP2 are formed on the surface of the insulating layer 11. The first input/output electrode P1, the second input/output electrode P2, and the ground electrodes GP1 and GP2 are, for example, conductors formed by Ni/Au plating a conductor pattern of Cu on the surface of the insulating layer 11.

Next, the protective layer 1 is formed on the surface of the insulating layer 11. The protective layer 1 has cavities formed at positions corresponding to the first input/output electrode P1, the second input/output electrode P2, and the ground electrodes GP1 and GP2. Therefore, even when the protective layer 1 is formed on the surface of the insulating layer 11, the first input/output electrode P1, the second input/output electrode P2, and the ground electrodes GP1 and GP2 are exposed on the surface of the protective layer 1. In exemplary aspects, the protective layer 1 is made of, for example, polyimide (PI) resin, epoxy (EP) resin, or polybenzoxazole (PBO) resin.

The second insulating layer TL2 and the inductor element L1 are formed on the second principal surface PS2 of the semiconductor substrate 21. Specifically, the coil conductor L11 is formed on the second principal surface PS2 of the semiconductor substrate 21. Next, a resin coating is applied to the second principal surface PS2 of the semiconductor substrate 21 until the coil conductor L11 is completely covered. After the resin is cured and the interlayer connection conductor V31 for electrical connection is formed, the coil conductor L12 is formed on the surface of the resin. An additional resin coating is applied until the coil conductor L12 is completely covered. Then, the resin is cured. The inductor element L1 including the coil conductors L11 and L12 is formed in this manner. The interlayer connection conductor V31 may be produced by forming a hole in resin cured by laser, or by forming a hole in uncured photosensitive resin.

Last, the wafer is cut with a dicing machine into individual thin-film ESD protection devices 101.

Second Embodiment

A second embodiment shows an example in which the second insulating layer includes a magnetic body.

Figure 6A:
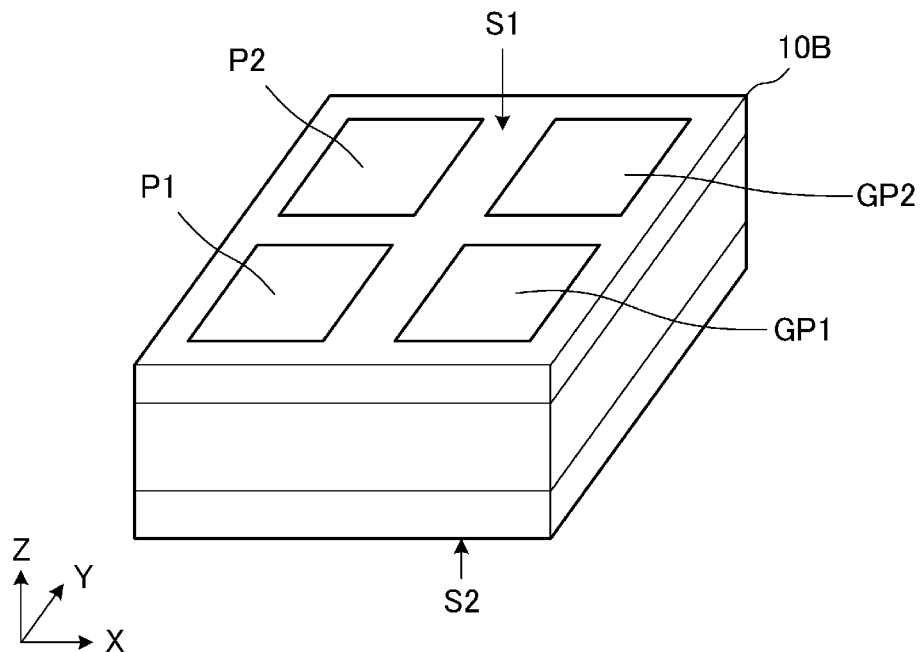
FIG. 6(A) is a perspective view of a thin-film ESD protection device 102 according to a second embodiment.
Figure 6B:
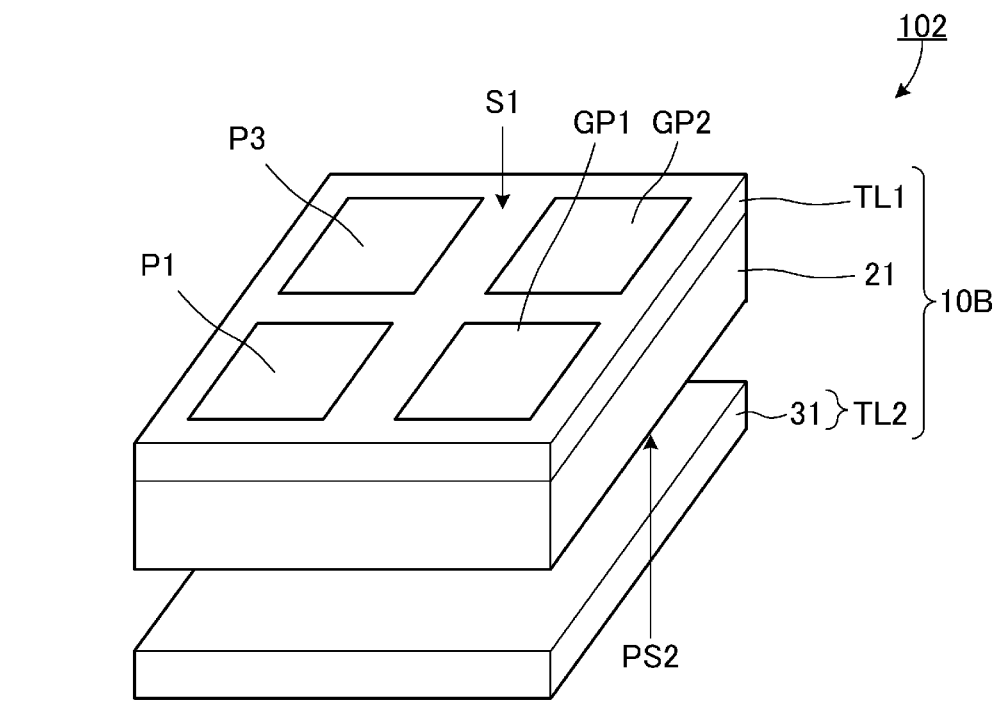
FIG. 6(B) is an exploded perspective view of the thin-film ESD protection device 102.
Figure 7A:
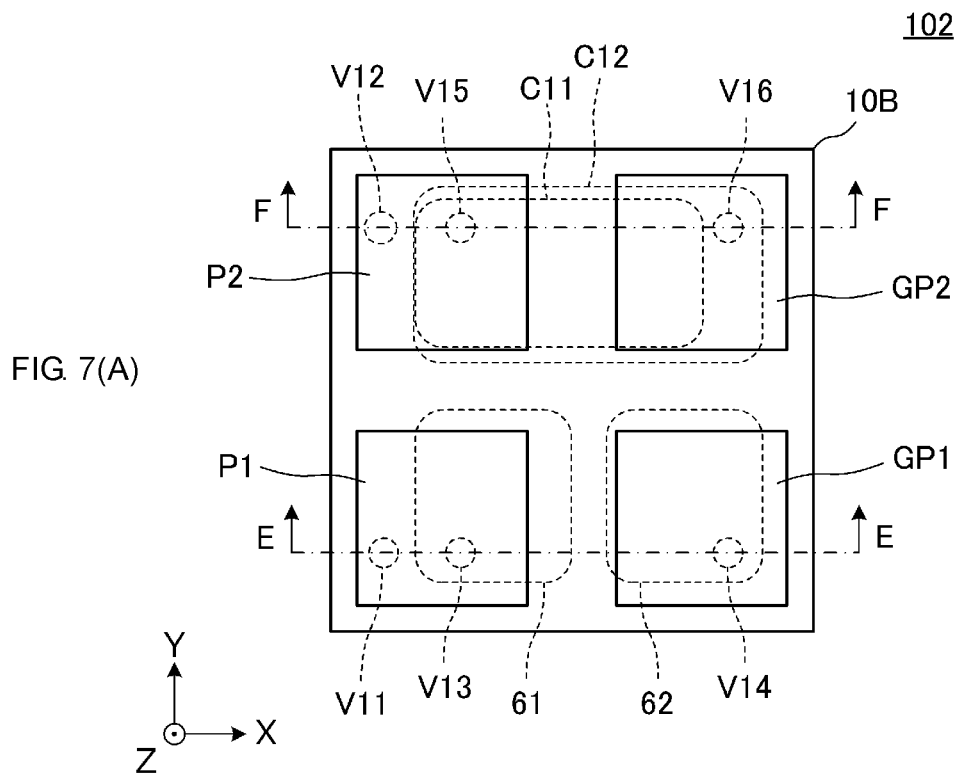
FIG. 7(A) is a plan view of the thin-film ESD protection device 102.
Figure 7B:
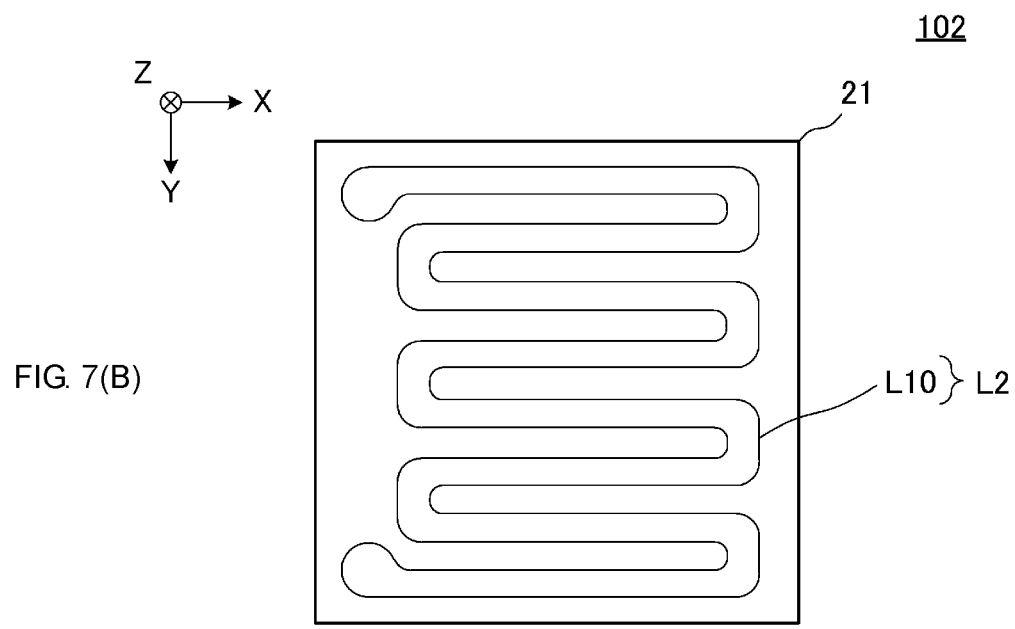
FIG. 7(B) is a plan view of a second principal surface of a semiconductor substrate 21 included in the thin-film ESD protection device 102.
Figure 8A:
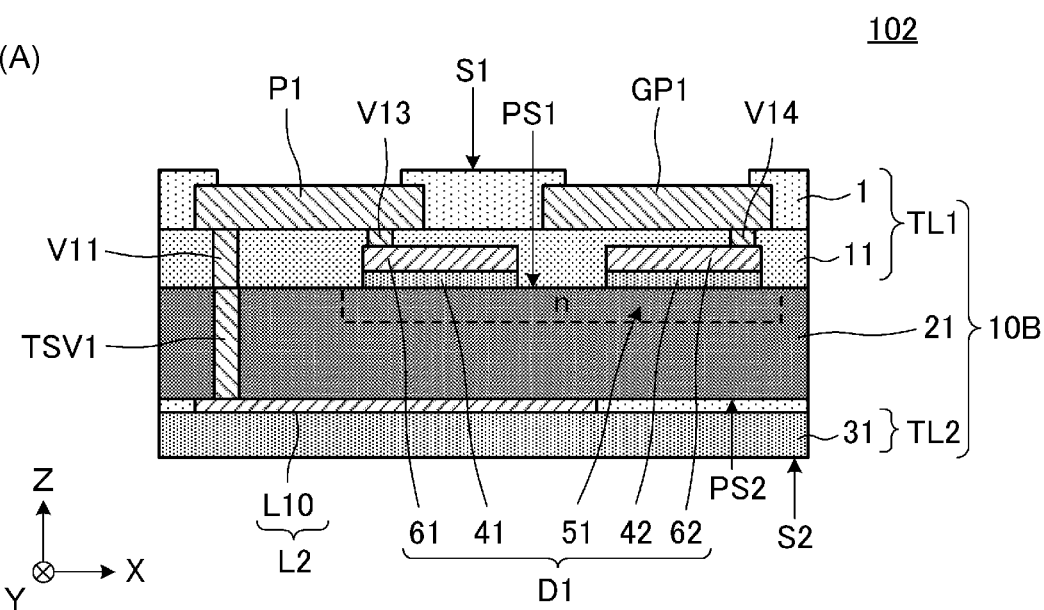
FIG. 8(A) is a cross-sectional view taken along line E-E in FIG. 7(A)
Figure 8B:
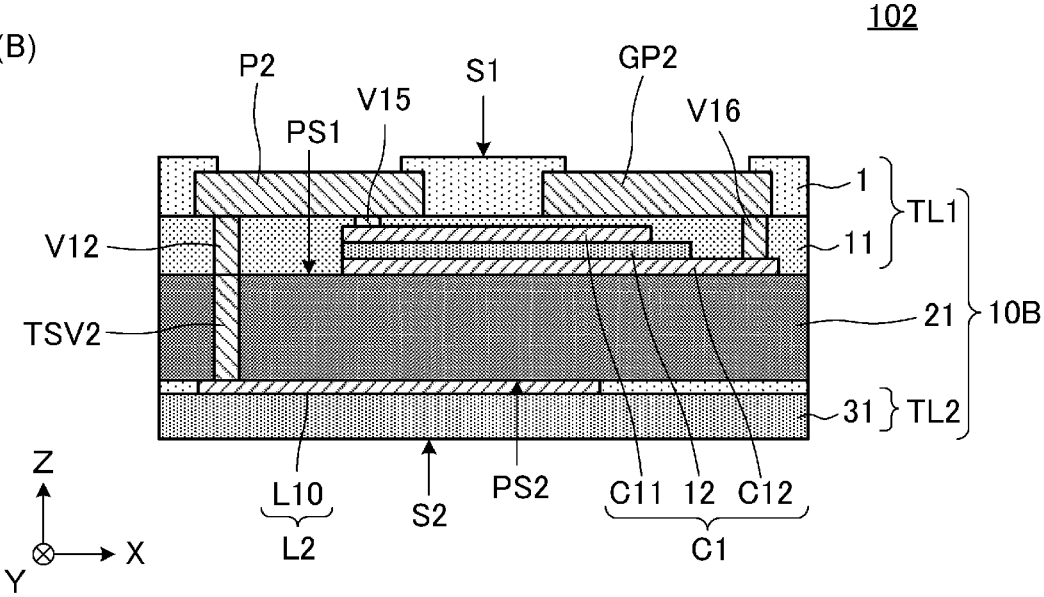
FIG. 8(B) is a cross-sectional view taken along line F-F in FIG. 7(A).

FIG. 6(A) is a perspective view of a thin-film ESD protection device 102 according to the second embodiment, and FIG. 6(B) is an exploded perspective view of the thin-film ESD protection device 102. FIG. 7(A) is a plan view of the thin-film ESD protection device 102, and FIG. 7(B) is a plan view of the second principal surface of the semiconductor substrate 21 included in the thin-film ESD protection device 102. FIG. 8(A) is a cross-sectional view taken along line E-E in FIG. 7(A), and FIG. 8(B) is a cross-sectional view taken along line F-F in FIG. 7(A). Note that a magnetic sheet 31 is omitted in FIG. 7(B) to make the structure easy to understand.

The thin-film ESD protection device 102 differs from the thin-film ESD protection device 101 of the first embodiment as described above in the structure of the second insulating layer TL2. The thin-film ESD protection device 102 also differs from the thin-film ESD protection device 101 in the structure of an inductor element L2. The other configurations are substantially the same as those of the thin-film ESD protection device 101.

Hereinafter, the differences from the thin-film ESD protection device 101 of the first embodiment will be described.

The second insulating layer TL2 according to the present embodiment is the magnetic sheet 31 attached to the second principal surface PS2 of the semiconductor substrate 21. For example, the magnetic sheet 31 is a resin sheet produced by dispersing magnetic powder, such as ferrite powder, into resin, such as epoxy resin.

In the present embodiment, the magnetic sheet 31 corresponds to "magnetic body" according to the present disclosure.

The inductor element L2 is formed adjacent to the second principal surface PS2 of the semiconductor substrate 21. Specifically, the inductor element L2 includes a coil conductor L10 and the magnetic sheet 31. The coil conductor L10 is a meandering conductor formed on the second principal surface PS2 of the semiconductor substrate 21.

As illustrated, for example, in FIG. 8(A), the one end of the coil conductor L10 (corresponding to "fifth end of inductor element") is electrically connected by the first via conductor TSV1 and the interlayer connection conductor V11 to the first input/output electrode P1. As illustrated, for example, in FIG. 8(B), the other end of the coil conductor L10 (corresponding to "sixth end of inductor element") is electrically connected by the second via conductor TSV2 and the interlayer connection conductor V12 to the second input/output electrode P2.

Aside from the effects described in the first embodiment, the thin-film ESD protection device 102 of the present embodiment has the following advantageous effects.

First, the thin-film ESD protection device 102 includes a magnetic body (i.e., a magnetic sheet 31) configured as the second insulating layer TL2. With this configuration, because of the high magnetic permeability of the magnetic sheet 31, an inductor element having a predetermined inductance value can be obtained even with fewer turns.

In the thin-film ESD protection device 102 of the present embodiment, a sufficient degree of isolation between the magnetic body and the capacitor element C1 is ensured. If the magnetic body is disposed near the capacitor element C1, a parasitic inductance in wiring around the capacitor element C1 (e.g., wiring between the fourth end E4 and the ground electrode GP2, wiring between the third end E3 and the second input/output electrode P2, or wiring between the third end E3 and the sixth end E6 in FIG. 5) may be too large to achieve predetermined filter characteristics. In the thin-film ESD protection device 102, where a sufficient degree of isolation between the magnetic body and the capacitor element C1 is ensured, a low-pass filter with low insertion loss can be obtained.

In general, forming a fine conductor pattern on the semiconductor substrate 21 to produce a coil conductor having many turns involves many manufacturing steps (e.g., stacking steps). However, the configuration described herein requires fewer person-hours in the manufacturing process and lower costs, because an inductor element having a predetermined inductance value can be produced simply by attaching the magnetic sheet 31 to the second principal surface of the semiconductor substrate 21.

Although the present embodiment shows an example in which the second insulating layer TL2 is a magnetic sheet attached to the second principal surface PS2 of the semiconductor substrate 21, the configuration is not limited to this configuration. The second insulating layer TL2 may be formed by applying a resin coating produced by dispersing magnetic powder, such as ferrite powder, into epoxy resin or the like, to the second principal surface PS2 of the semiconductor substrate 21 having the coil conductor L10 formed thereon.

Although the present embodiment shows an exemplary thin-film ESD protection device which includes the magnetic sheet 31, it is noted that the "magnetic body" should not be so limited. For example, the "magnetic body" can be a chip made of sintered magnetic ferrite.

The inductor element may include a plurality of coil conductors formed in layers on the second principal surface PS2 of the semiconductor substrate 21. However, the semiconductor substrate 21 that has been subjected to thinning is difficult to handle, and may be damaged by repetition of photolithography and plating steps. For reduction of person-hours in the manufacturing process and convenience in mass production, it is preferable, as in the present embodiment, that the magnetic sheet be attached.

Third Embodiment

A third embodiment shows an example in which the structure of the second insulating layer differs from that in the second embodiment.

Figure 9A:
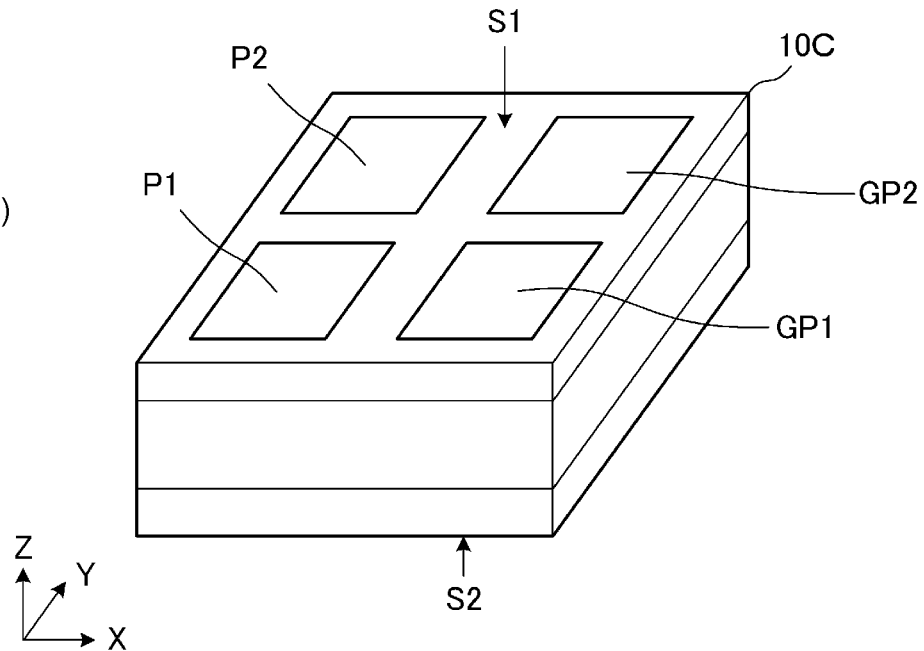
FIG. 9(A) is a perspective view of a thin-film ESD protection device 103 according to a third embodiment.
Figure 9B:
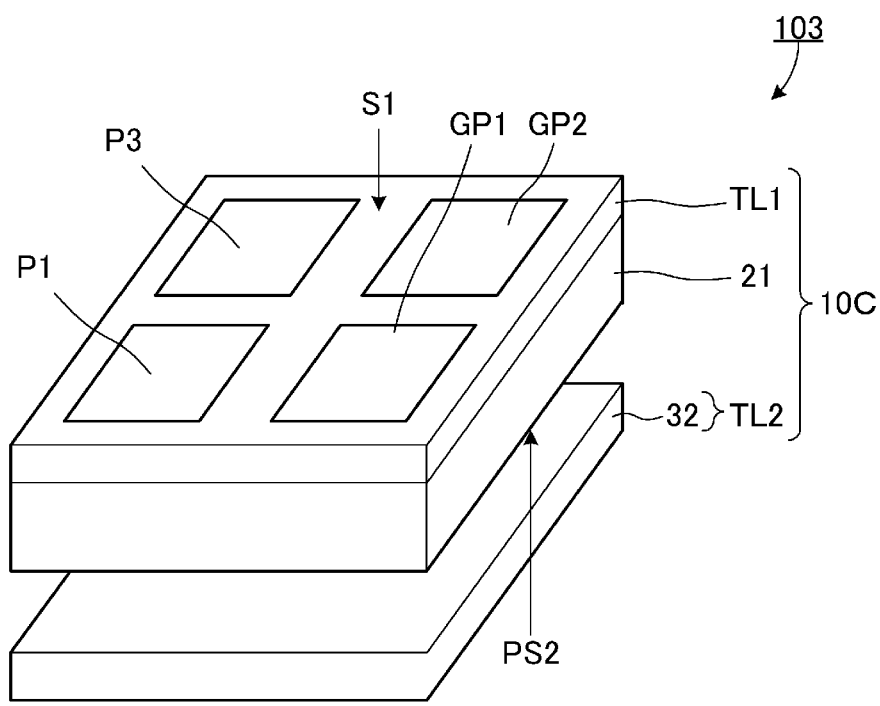
FIG. 9(B) is an exploded perspective view of the thin-film ESD protection device 103.
Figure 10A:
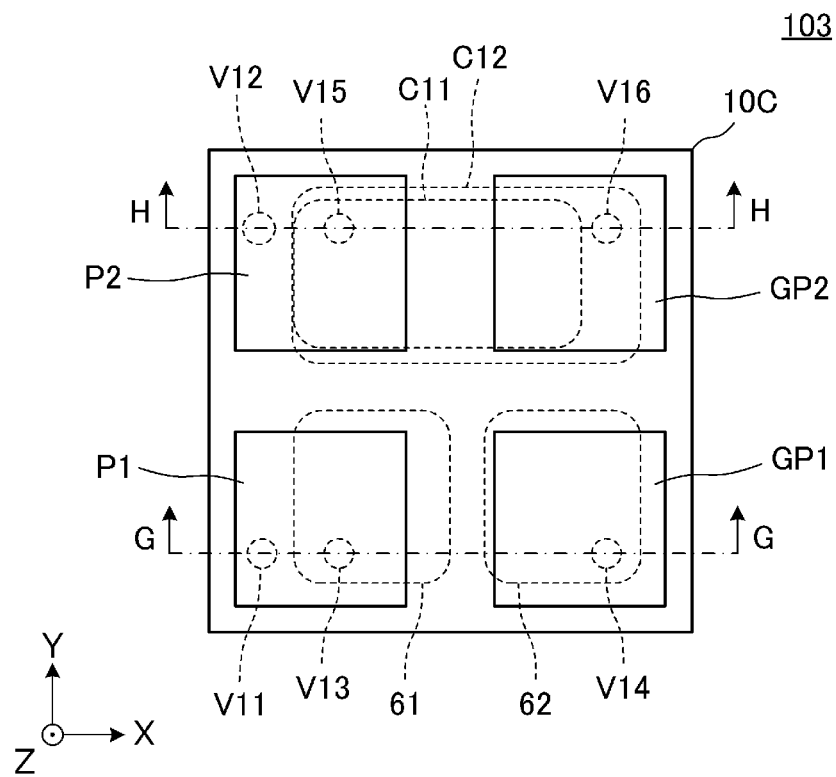
FIG. 10(A) is a plan view of the thin-film ESD protection device 103.
Figure 10B:
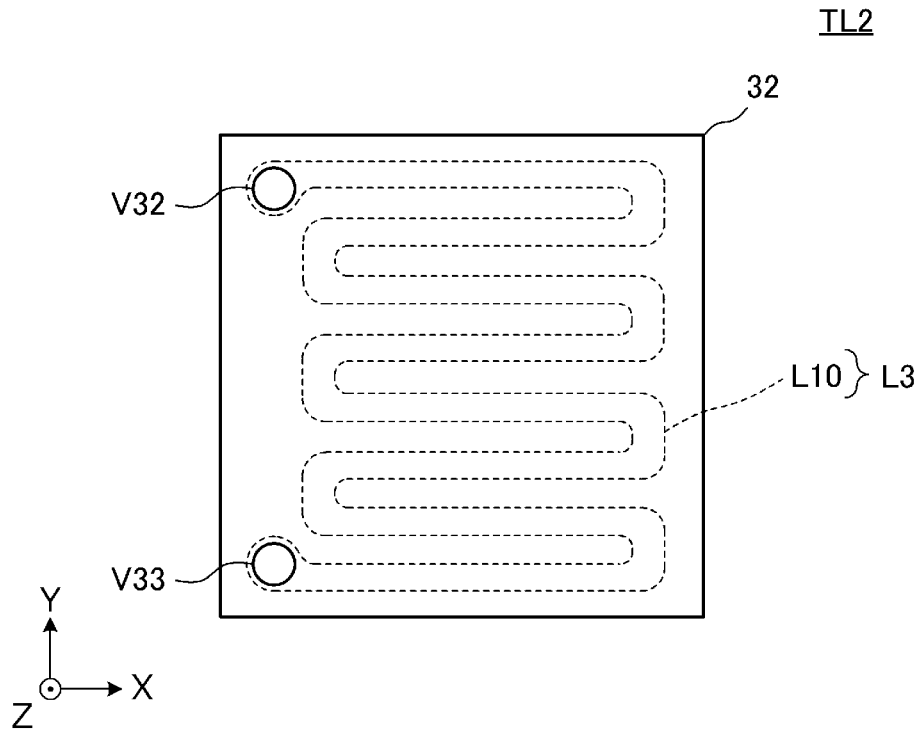
FIG. 10(B) is a plan view of a sheet 32 included in the thin-film ESD protection device 103.
Figure 11A:
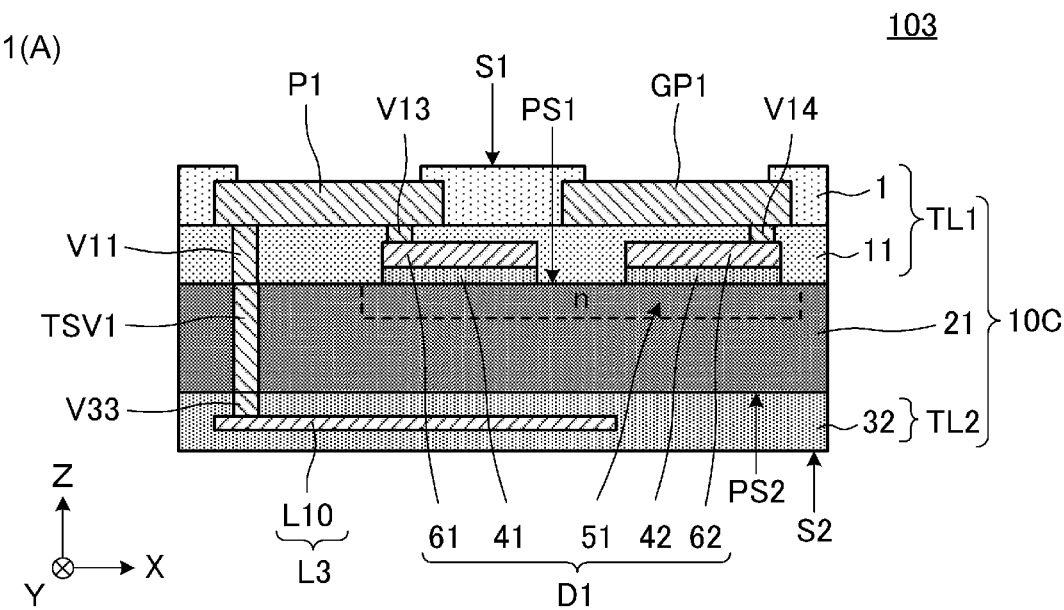
FIG. 11(A) is a cross-sectional view taken along line G-G in FIG. 10(A)
Figure 11B:
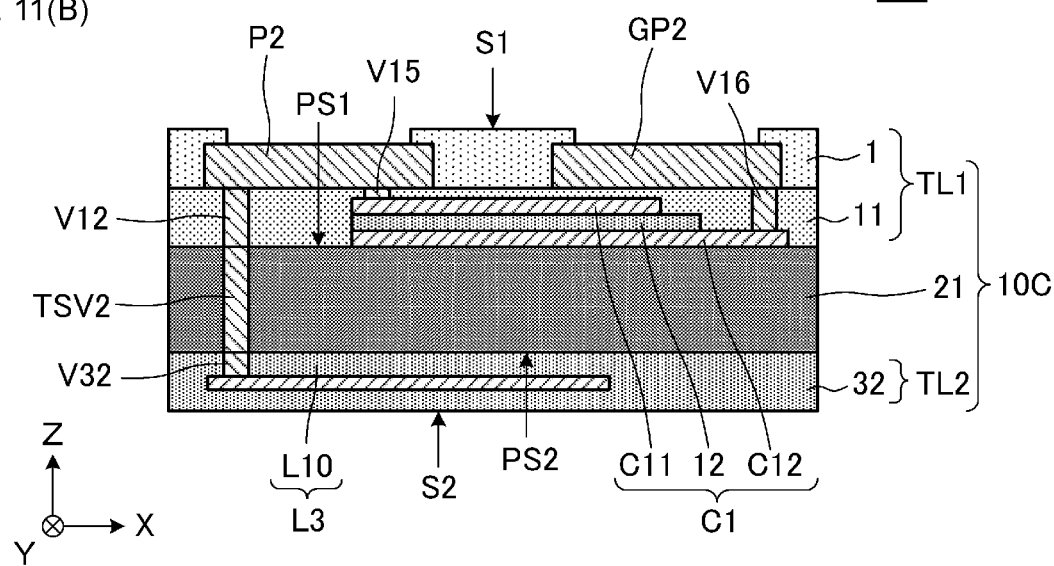
FIG. 11(B) is a cross-sectional view taken along line H-H in FIG. 10(A).

FIG. 9(A) is a perspective view of a thin-film ESD protection device 103 according to the third embodiment, and FIG. 9(B) is an exploded perspective view of the thin-film ESD protection device 103. FIG. 10(A) is a plan view of the thin-film ESD protection device 103, and FIG. 10(B) is a plan view of a sheet 32 included in the thin-film ESD protection device 103. FIG. 11(A) is a cross-sectional view taken along line G-G in FIG. 10(A), and FIG. 11(B) is a cross-sectional view taken along line H-H in FIG. 10(A).

The thin-film ESD protection device 103 differs from the thin-film ESD protection device 102 of the second embodiment described above in the structure of the second insulating layer TL2. The thin-film ESD protection device 103 also differs from the thin-film ESD protection device 102 in the structure of an inductor element L3. The other configurations are substantially the same as those of the thin-film ESD protection device 102.

Hereinafter, the differences from the thin-film ESD protection device 102 of the second embodiment will be described.

The second insulating layer TL2 according to the present embodiment is the sheet 32 attached to the second principal surface PS2 of the semiconductor substrate 21. The sheet 32 includes therein the coil conductor L10 and the interlayer connection conductors V32 and V33. As illustrated in FIG. 10(B), the interlayer connection conductors V32 and V33 are each exposed at one end thereof on the surface of the sheet 32. For example, the sheet 32 is a resin sheet produced by dispersing magnetic powder, such as ferrite powder, into resin, such as epoxy resin.

In the present embodiment, the sheet 32 corresponds to "magnetic body" according to the present disclosure.

As illustrated in FIGS. 11(A) and 11(B), attaching the sheet 32 to the second principal surface PS2 of the semiconductor substrate 21 allows the interlayer connection conductor V33 to be electrically connected to the first via conductor TSV1 exposed on the second principal surface PS2 of the semiconductor substrate 21, and also allows the interlayer connection conductor V32 to be electrically connected to the second via conductor TSV2 exposed on the second principal surface PS2 of the semiconductor substrate 21. The interlayer connection conductors V32 and V33 and the corresponding via conductors (i.e., the first via conductor TSV1 and the second via conductor TSV2) are joined by a conductive bonding material, such as solder, or may be joined by Au—Sn ultrasonic bonding.

The inductor element L3 is formed in the second insulating layer TL2 and includes the coil conductor L10 and the sheet 32. The coil conductor L10 is a meandering conductor formed inside the sheet 32 (second insulating layer TL2).

As illustrated, for example, in FIG. 11(A), the one end of the coil conductor L10 (corresponding to "fifth end of inductor element") is electrically connected by the first via conductor TSV1 and the interlayer connection conductors V11 and V33 to the first input/output electrode P1. As illustrated, for example, in FIG. 11(B), the other end of the coil conductor L10 (corresponding to "sixth end of inductor element") is electrically connected by the second via conductor TSV2 and the interlayer connection conductors V12 and V32 to the second input/output electrode P2.

Aside from the effects described in the second embodiment, the thin-film ESD protection device 103 of the present embodiment has the following advantageous effects.

Specifically, in the present embodiment, the inductor element L3 includes the sheet 32 (magnetic body) and the coil conductor L10 formed in the sheet 32. Therefore, by the magnetic shielding effect of the magnetic body, a magnetic field from the inductor element L3 can be prevented from radiating out of the sheet 32. This further improves isolation between the capacitor element C1 and the inductor element L3. When the coil conductor L10 is formed inside the sheet 32 as in the present embodiment, the magnetic field from the inductor element L3 can be more effectively prevented from radiating out of the sheet 32.

Fourth Embodiment

A fourth embodiment shows an example in which the structure of the first via conductor and the second via conductor differs from that in the embodiments described above.

Figure 12A:
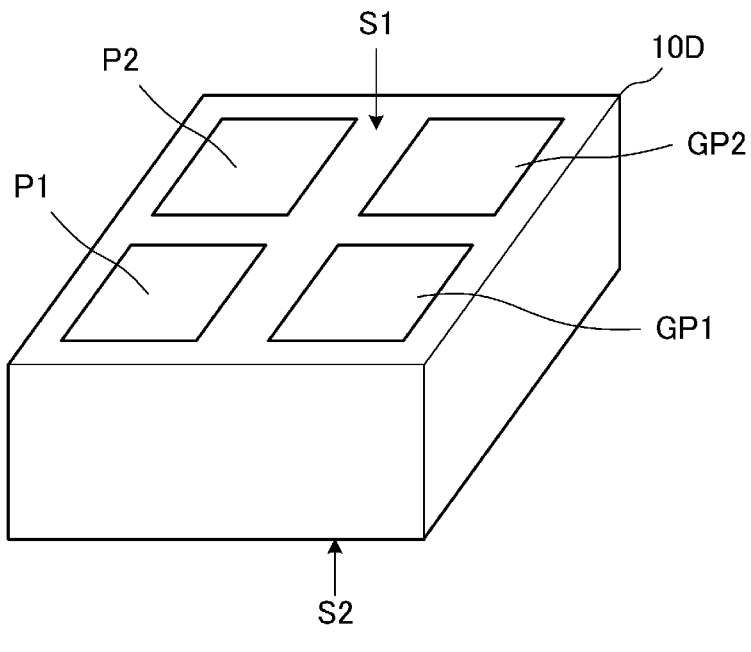
FIG. 12(A) is a perspective view of a thin-film ESD protection device 104 according to a fourth embodiment.
Figure 12B:
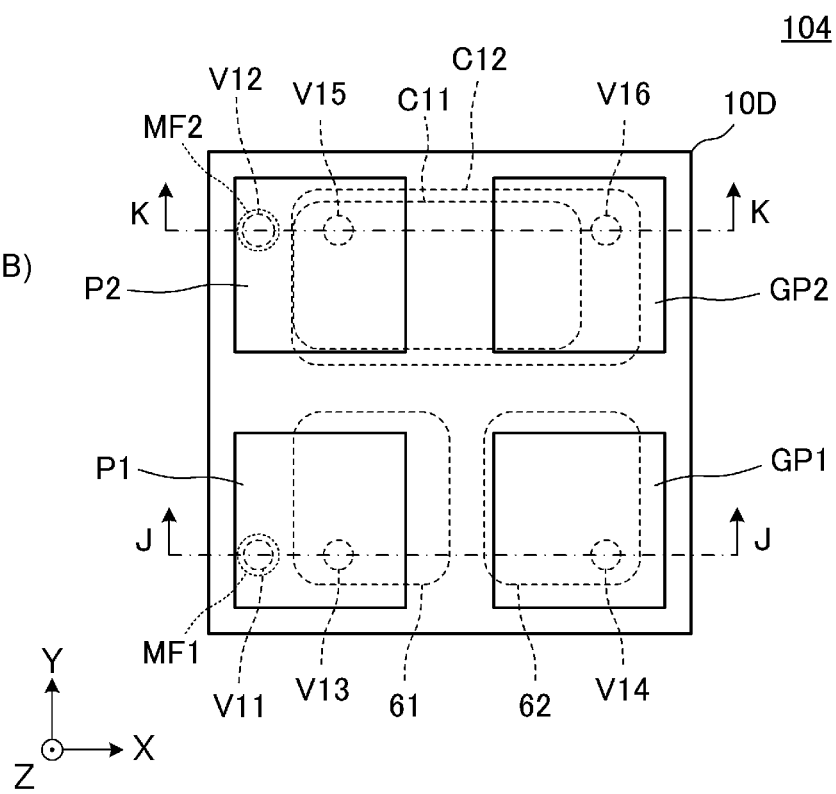
FIG. 12(B) is a plan view of the thin-film ESD protection device 104.
Figure 13A:
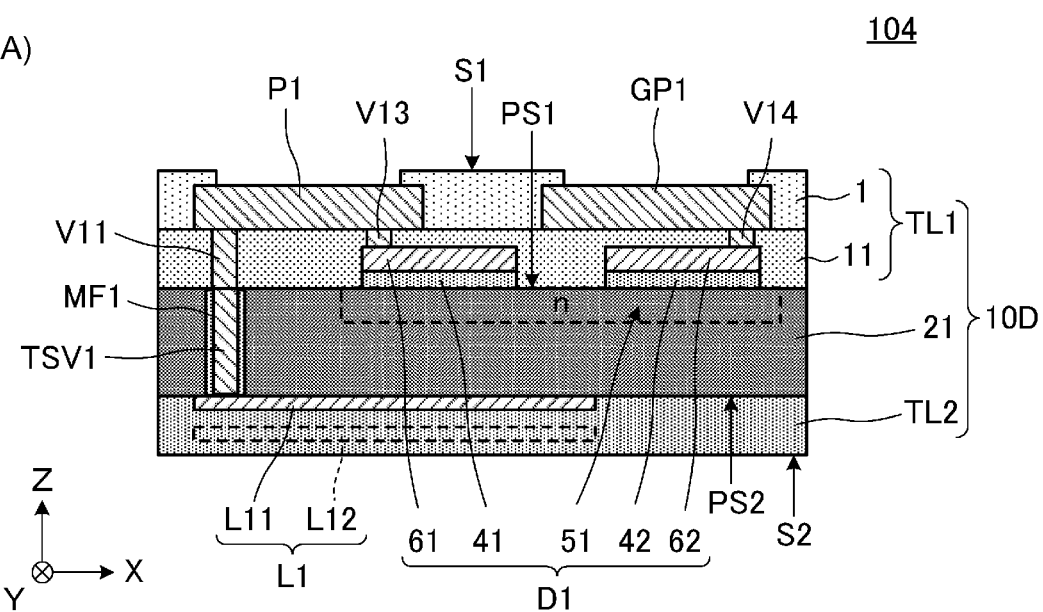
FIG. 13(A) is a cross-sectional view taken along line J-J in FIG. 12(B)

FIG. 12(A) is a perspective view of a thin-film ESD protection device 104 according to the fourth embodiment, and FIG. 12(B) is a plan view of the thin-film ESD protection device 104. FIG. 13(A) is a cross-sectional view taken along line J-J in FIG. 12(B), and FIG. 13(B) is a cross-sectional view taken along line K-K in FIG. 12(B).

The thin-film ESD protection device 104 differs from the thin-film ESD protection device 101 of the first embodiment described above in that it includes magnetic films MF1 and MF2. The other configurations are the same as those of the thin-film ESD protection device 101.

Hereinafter, the difference from the thin-film ESD protection device 101 of the first embodiment will be described.

Figure 13B:
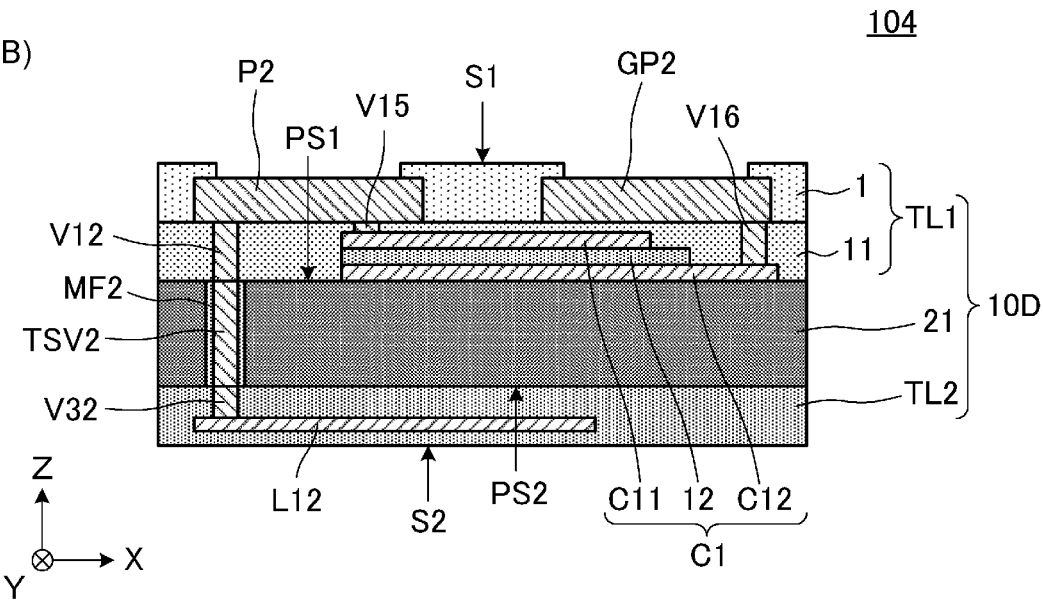
FIG. 13(B) is a cross-sectional view taken along line K-K in FIG. 12(B).

In the present embodiment, as illustrated in FIG. 12(B) and FIGS. 13(A) and 13(B), the magnetic film MF1 is formed into a cylindrical (or straw-like) shape on the outer periphery of the first via conductor TSV1, and the magnetic film MF2 is formed into a cylindrical (or straw-like) shape on the outer periphery of the second via conductor TSV2. The magnetic films MF1 and MF2 are magnetic layers formed on the respective inner walls of holes that are formed by the Bosch process in such a manner that they pass through the semiconductor substrate 21 from the first principal surface PS1 to the second principal surface PS2.

The parasitic inductance of the first via conductor TSV1 is increased by forming the magnetic film MF1, and the parasitic inductance of the second via conductor TSV2 is increased by forming the magnetic film MF2.

Figure 14:
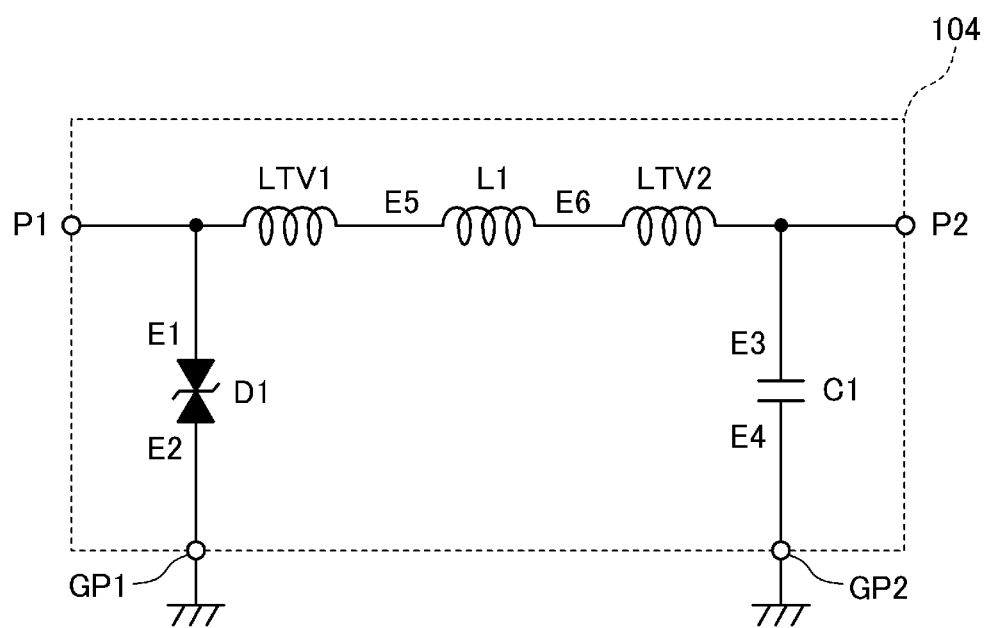
FIG. 14 is a circuit diagram of the thin-film ESD protection device 104.

FIG. 14 is a circuit diagram of the thin-film ESD protection device 104. In FIG. 14, the parasitic inductance of the first via conductor TSV1 is represented by an inductor LTV1, and the parasitic inductance of the second via conductor TSV2 is represented by an inductor LTV2.

In the thin-film ESD protection device 104, as illustrated in FIG. 14, the inductor LTV1, the inductor element L1, and the inductor LTV2 are connected in series between the first input/output electrode P1 and the second input/output electrode P2. With this configuration, a predetermined inductance can be easily obtained.

This simply involves forming magnetic layers on the respective inner walls of holes passing through the semiconductor substrate 21 from the first principal surface PS1 to the second principal surface PS2. Therefore, without significantly increasing the number of person-hours in the manufacturing process, the inductance component of the thin-film ESD protection device can be improved more easily than when, for example, coil conductors are stacked.

Other Embodiments

It is noted that although the exemplary embodiments described above show an example in which the multilayer body is a rectangular-parallelepiped-shaped body which is rectangular in plan view, the configuration is not limited to this. The shape of the multilayer body may be appropriately changed to an extent which does not impair the advantageous effects of the present invention. The multilayer body may be, for example, polygonal, circular, oval, L-shaped, crank-shaped, T-shaped, or Y-shaped in plan view. Like the multilayer body, the semiconductor substrate may also be appropriately changed in shape to an extent which does not impair the advantageous effects of the present invention.

The exemplary embodiments described above show an exemplary inductor element having a winding axis extending in the Z-axis direction, or an exemplary inductor element having a meandering shape. However, the configuration is not limited to this. The shape and the number of winding turns of the inductor element may be appropriately changed to an extent which does not impair the advantageous effects of the present invention. The inductor element may have, for example, a planar spiral shape, a planar loop shape, or a helical shape. The winding axis of the inductor element may also be appropriately changed to an extent which does not impair the advantageous effects of the present invention. For example, the winding axis of the inductor element may extend along the X-axis direction or Y-axis direction.

Although the exemplary embodiments described above show an example of the n-type semiconductor layer 51 formed by doping the first principal surface PS1 of the semiconductor substrate 21 with n-type impurities, the configuration is not limited to this. For example, like the p-type semiconductor layer 41, the n-type semiconductor layer 51 may be formed by patterning on the first principal surface PS1 of the semiconductor substrate 21. Although the embodiments described above show the diode element D1 formed by connecting the cathodes of two p-n junction diodes, the diode element is not limited to this. The diode element of the present invention may be one p-n junction diode, or may be formed by connecting the anodes of two p-n junction diodes.

Although the exemplary embodiments described above show an exemplary thin-film ESD protection device where a low-pass filter is formed, the configuration is not limited to this. A circuit formed in the thin-film ESD protection device may be appropriately changed to an extent which does not impair the advantageous effects of the present invention.

Although the exemplary embodiments described above show an example in which the first input/output electrode P1, the second input/output electrode P2, and the ground electrodes GP1 and GP2 are rectangular conductors, the configuration is not limited to this. The first input/output electrode P1, the second input/output electrode P2, and the ground electrodes GP1 and GP2 may be appropriately changed in shape. The arrangement and the number of the first input/output electrode P1, the second input/output electrode P2, and the ground electrodes GP1 and GP2 may also be appropriately changed, in accordance with the circuit configuration of the thin-film ESD protection device. The number of ground electrodes may be, for example, one or more than two.

The description of the exemplary embodiments is illustrative and not restrictive in all aspects. Modifications and changes may be appropriately made by those skilled in the art. The scope of the present invention is defined by the appended claims, not by the embodiments described above. Changes made to the embodiments within the appended claims and scopes equivalent thereto are also embraced by the present invention.

REFERENCE SIGNS LIST

C1: capacitor element
D1: diode element
L1, L2, L3: inductor element
C11: first capacitor electrode
C12: second capacitor electrode
E1: first end of diode element
E2: second end of diode element
E3: third end of capacitor element
E4: fourth end of capacitor element
E5: fifth end of inductor element
E6: sixth end of inductor element
L10, L11, L12: coil conductor
LTV1: inductor
LTV2: inductor
MF1, MF2: magnetic film
P1: first input/output electrode
P2: second input/output electrode
GP1, GP2: ground electrode
PS1: first principal surface of semiconductor substrate
PS2: second principal surface of semiconductor substrate
S1: first surface of multilayer body
S2: second surface of multilayer body
TL1: first insulating layer
TL2: second insulating layer
TSV1: first via conductor
TSV2: second via conductor
V11, V12, V13, V14, V15, V16, V31, V32, V33: interlayer connection conductor
1: protective layer
10A: multilayer body
11: insulating layer
12: thin-film dielectric layer
21: semiconductor substrate
31: magnetic sheet
32: sheet
41, 42: p-type semiconductor layer
51: n-type semiconductor layer
61, 62: diode electrode
101, 102, 103, 104: thin-film ESD protection device

The invention claimed is:

1. A thin-film ESD protection device comprising:
   a semiconductor substrate having first and second principal surfaces that oppose each other;
   a first insulating layer disposed on the first principal surface;
   a first input/output electrode, a second input/output electrode, and a ground electrode each disposed on a surface of the first insulating layer;
   a diode element disposed adjacent to the first principal surface of the semiconductor substrate and electrically connected between the first input/output electrode and the ground electrode;
   a capacitor element disposed adjacent to the first principal surface of the semiconductor substrate and electrically connected between the second input/output electrode and the ground electrode; and
   an inductor element disposed adjacent to the second principal surface of the semiconductor substrate and electrically connected to the first input/output electrode by a first via conductor passing through the semiconductor substrate between the first and second principal surfaces and to the second input/output electrode by a second via conductor passing through the semiconductor substrate between the first and second principal surfaces.

2. The thin-film ESD protection device according to claim 1, wherein the semiconductor substrate is a high-resistivity substrate having an average electrical resistivity of at least 1.0 (Ω·cm).

3. The thin-film ESD protection device according to claim 1, wherein the diode element does not overlap the capacitor element in a plan view of the first principal surface of the semiconductor substrate.

4. The thin-film ESD protection device according to claim 1, wherein the semiconductor substrate, the first insulating layer, and a second insulating layer disposed on the second principal surface of the semiconductor substrate form a multilayer body having a rectangle shape with first and second sides opposite each other in a plan view of the first principal surface of the semiconductor substrate.

5. The thin-film ESD protection device according to claim 4, wherein the first input/output electrode and the second input/output electrode are disposed closer to the first side of the multilayer body than the second side, and the ground electrode is disposed closer to the second side of the multilayer body than the first side.

6. The thin-film ESD protection device according to claim 5, wherein the second insulating layer at least partly comprises a magnetic body, and the inductor element includes the magnetic body and a coil conductor disposed adjacent to the second principal surface of the semiconductor substrate.

7. The thin-film ESD protection device according to claim 6, wherein the coil conductor is disposed on the second principal surface, and the magnetic body comprises a magnetic sheet attached to the second principal surface.

8. The thin-film ESD protection device according to claim 6, wherein the inductor element includes the magnetic body and the coil conductor, and the magnetic body comprises a magnetic sheet attached to the second principal surface of the semiconductor substrate.

9. The thin-film ESD protection device according to claim 1, wherein at least one of the first via conductor and the second via conductor has a magnetic film disposed over an outer periphery thereof.

10. The thin-film ESD protection device according to claim 1, wherein the inductor element and the capacitor element form a low-pass filter.

11. A thin-film ESD protection device comprising:
a semiconductor substrate with first and second opposing surfaces;
first and second insulating layers disposed on the first and second surfaces of the semiconductor substrate, respectively;
a first input/output electrode, a second input/output electrode, and a ground electrode each disposed on the first insulating layer;
a diode element collectively formed in the semiconductor substrate and the first insulating layer and that is electrically connected between the first input/output electrode and the ground electrode;
a capacitor element formed in the first insulating layer and electrically connected between the second input/output electrode and the ground electrode; and
an inductor element formed in the second insulating layer electrically connected between the first and second input/output electrodes.

12. The thin-film ESD protection device according to claim 11, further comprising first and second via conductors passing through the semiconductor substrate between the first and second principal surfaces thereof, with the inductor element connected to the first input/output electrode by the first via conductor and connected to the second input/output electrode by the second via conductor.

13. The thin-film ESD protection device according to claim 11, wherein the semiconductor substrate is a high-resistivity substrate having an average electrical resistivity of at least 1.0 (Ω·cm).

14. The thin-film ESD protection device according to claim 11, wherein the diode element does not overlap the capacitor element in a plan view of the first principal surface of the semiconductor substrate.

15. The thin-film ESD protection device according to claim 11, wherein the semiconductor substrate and the first and insulating layers form a multilayer body having a rectangle shape with first and second sides opposite each other in a plan view of the first principal surface of the semiconductor substrate.

16. The thin-film ESD protection device according to claim 15, wherein the first input/output electrode and the second input/output electrode are disposed closer to the first side of the multilayer body than the second side, and the ground electrode is disposed closer to the second side of the multilayer body than the first side.

17. The thin-film ESD protection device according to claim 16, wherein the second insulating layer at least partly comprises a magnetic body, and the inductor element includes the magnetic body and a coil conductor disposed adjacent to the second principal surface of the semiconductor substrate.

18. The thin-film ESD protection device according to claim 17, wherein the coil conductor is disposed on the second principal surface, and the magnetic body comprises a magnetic sheet attached to the second principal surface.

19. The thin-film ESD protection device according to claim 17, wherein the inductor element includes the magnetic body and the coil conductor, and the magnetic body comprises a magnetic sheet attached to the second principal surface of the semiconductor substrate.

20. The thin-film ESD protection device according to claim 12, wherein at least one of the first via conductor and the second via conductor has a magnetic film disposed over an outer periphery thereof.

* * * * *